United States Patent [19]

Ammon et al.

[11] 4,378,632

[45] Apr. 5, 1983

[54] METHOD OF AND APPARATUS FOR PULL-FITTING CONTACTS

[75] Inventors: J. Preston Ammon; Harry R. Weaver, both of Dallas, Tex.; Richard O. Norman, Camarillo, Calif.

[73] Assignee: ELFAB Corporation, Addison, Tex.

[21] Appl. No.: 219,994

[22] Filed: Dec. 23, 1980 (Under 37 CFR 1.47)

[51] Int. Cl.[3] .......................... H05K 3/00; B23P 19/00

[52] U.S. Cl. ........................................ 29/845; 29/739

[58] Field of Search ................. 29/739, 741, 842, 843, 29/845, 882; 269/309, 310; 227/141; 254/29 A

[56] References Cited

U.S. PATENT DOCUMENTS 3,671,917 6/1972 Ammon et al. .

3,800,416 4/1974 Schultz, Jr. et al. ............ 29/739 X 3,977,075 8/1976 Lynch et al. ............... 228/180 R X 4,035,047 7/1977 Ammon .

4,216,576 8/1980 Ammon et al. .

*Primary Examiner*—Francis S. Husar

*Assistant Examiner*—Carl J. Arbes

*Attorney, Agent, or Firm*—Thomas L. Chrisman; Stanley R. Moore

[57] ABSTRACT

A method and apparatus for pull fitting contacts. Contacts tails initially are placed through apertures on a mounting member. A support member having a pair of clamping jaws which clamp the contact ends encloses an actuation plate which after the tails are clamped pushes the mounting member relative to the support member thereby inserting the contacts completely into an insulative housing.

17 Claims, 8 Drawing Figures

METHOD OF AND APPARATUS FOR PULL-FITTING CONTACTS

BACKGROUND OF THE INVENTION

1. Field of the Invention

The invention is directed to a method and apparatus for installing contacts into a mounting member such as an apertured substrate or a connector insulator body; more particularly, to a novel method and apparatus for pull-fitting press fittable contacts into apertures in a mounting member.

2. History of the Prior Art

In the recent past, press-fit technology has provided marked improvements in the manner in which contacts are rigidly mounted in substrates and other mounting fixtures and has, thus, virtually revolutionized the manufacturing techniques utilized in the electrical interconnection industry.

Prior to press fitting contacts into apertures formed in printed circuit board substrates, electrical terminals were conventionally soldered therein. Solder comprising a tin/lead alloy has been, and to a certain extent still is, a metallurgical mainstay of the electrical connector industry. Certain innovations have, however, proposed means for replacing solder and the problems associated therewith in the connector industry. U.S. Pat. No. 4,216,576, assigned to the assignee of the present invention, teaches such technology which includes coating insulative substrates and plated through apertures therein with a protective resin coating which is selectively penetrated during the process of press fitting the contact into position. It may be seen, however, that in general only those contacts and contact-insulator configurations which lend themselves to receiving and transferring press fit forces may be utilized with the "solderless" electrical connector technology. It is advantageous to provide manufacturing methods and apparatus whereby connectors of all designs may reap the benefits of a press fit and/or solderless interconnection with a plated through hole with which it is electrically and mechanically interconnected.

Traditionally, press-fit technology has required a contact which includes a transversely broadened press-fit bullet region which is to be received with an interference fit into a plated through aperture in a printed circuit board or into an aperture in a connector insulator. A pair of transversely extending shoulders immediately above the press-fit region are generally provided and used to transmit press fitting forces from the installation tool to the contacts so as to produce a reliable electrical and mechanical interengagement between the contact and an aperture after it has been interference fitted into position. The broad concept of press fit technology is shown and described in U.S. Pat. No. 3,671,917 assigned to the assignee of the present invention.

In certain connector applications and with certain types of electrical contacts it is impossible to provide a press fit load transmitting shoulder. For example, where a press fit region is provided on a contact formed from either square wire stock or formed by means of a screw machine into a cylindrical type of contact, it is not generally possible to form a press insertion load bearing shoulder upon the contacts. The manufacture of such contacts and a further discussion of the problems is set forth and described in copending U.S. patent application Ser. No. 174,889, assigned to the assignee of the present invention. In summary, it is necessary in such contact embodiments to provide other means for applying a longitudinal force of sufficient magnitude to the contacts in order to press fit them into receiving apertures.

Certain prior art metal-to-metal connector constructions have approached press fit assembly problems by providing an upper contact mating region comprising a narrow blade portion which also defines a lower, press fit shoulder. One such contact, formed from square wire stock, is shown and described in U.S. Pat. No. 4,035,047 assigned to the assignee of the present invention. However, card edge connector contacts formed from square wire generally include a bowed or folded bellows type mating region which essentially prohibits the application of a press fitting force directly to the top of the contact and utilizes the required transversely extending press fit insertion load bearing shoulder region to seat the contact. For this reason many card edge connectors may be rigidly mounted only by wave soldering of the contacts into plated through holes in a mounting substrate.

Prior art pull fitting machines have been used to pull contacts into an insulator but these have required more complex construction, not adapted to different contact spacings. Moreover, none of these prior art devices could pull contacts into a wide mounting substrate such as a printed circuit board.

Many contact-insulator assemblies constructed today without press fit contact regions comprise what is generally called a discrete connector. This assembly is usually mounted to an insulative substrate such as FR-4 or G-10 printed circuit board material by soldering of the contact tails within plated apertures through the substrate. Since most discrete connectors are not constructed in a manner facilitating press fit or the advantages thereof, it would be of enormous advantage to provide a means for affecting a press fit interconnection with existing discrete connector designs. The initial problem in applying press fit technology to the mounting of a discrete connector is the provision of a transversely extending press fit bullet region on the discrete connector contact tail. This aspect is addressed in copending U.S. patent application Ser. No. 174,889, assigned to the assignee of the present invention. The method and apparatus for coining a press fit bullet portion on such contacts thus permits a manner of press fit assembly which is not limited in approach by the individual connector configuration. For example, a contact having a fragile bellows-type contacting region, as shown in said copending application, cannot be press fitted by the application of a top loaded insertion force. The method and apparatus of the present invention provide a means for "pull fitting" electrical contacts into apertures located in a substrate or other receiving member. In this manner any contact configuration can incorporate the multitudinous advantages of press fit technology for solderless interconnection.

SUMMARY OF THE INVENTION

The invention comprises a method and apparatus for applying longitudinal forces to the tails of contact members inserted through receiving apertures to pull fit those contacts into a rigid mechanical and/or electrical engagement with receiving apertures. More particularly, the invention includes improved apparatus for mounting contacts positioned within a mounting member of the type wherein contacts having tails protruding from the bottom of the mounting member in two spaced parallel rows are mounted within the mounting member by the application of a longitudinal force to the contacts. The improvement comprises an upstanding support member for lying beneath the mounting member in support thereof and between the contact tails protruding therefrom. Means are provided for clamping the contact tails against the support member with the mounting member thereabove. Means are also provided for moving the mounting member upwardly relative to the support member and contacts clamped thereto for mounting the contacts within the mounting member.

In yet another aspect the invention includes a method of mounting contacts having tails protruding in two spaced parallel rows from the bottom of a mounting member by applying a longitudinal force to the contacts relative to the mounting member. The method comprises the steps of providing a support member for supporting the mounting member between the contact tails protruding therefrom and positioning the mounting member and contacts upon the support member. Next, means are provided for clamping the contact tails to the support member with the mounting member thereabove. The contact tails are then clamped to the support member. Means are provided for moving the mounting member upwardly relative to the support member and contacts clamped thereto, and the mounting member is then moved upwardly relative to the support member and contacts clamped thereto for mounting the contacts within the mounting member. Finally, the contact tails are unclamped from the support member for releasing the mounting member and contacts mounted therein.

BRIEF DESCRIPTION OF THE DRAWINGS

For a more complete understanding of the present invention and for further objects and advantages thereof, reference may now be had to the following description taken in conjunction with the accompanying drawing in which:

FIG. 4*d* is a side schematic view of the apertures of the invention with the gripping jaws open and the seating pins retracted; and FIG. 5 is a schematic diagram of the pneumatic actuation system of the apparatus of the invention.

DETAILED DESCRIPTION OF THE DRAWINGS

Figure 1:
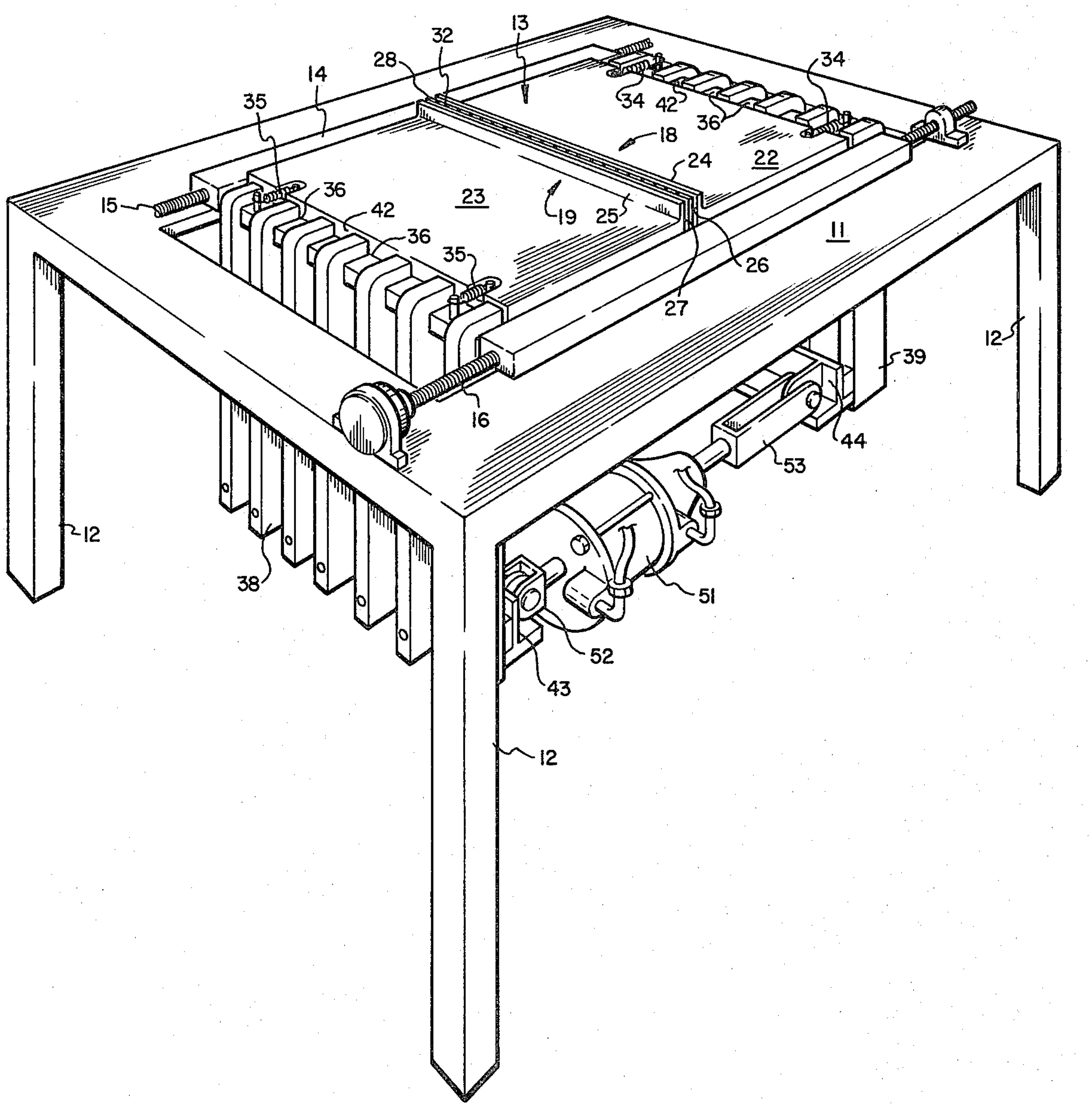
FIG. 1 is a top perspective view of an apparatus constructed in accordance with the teachings of the present invention.

Referring first to FIG. 1, there is shown a top perspective view of a portion of the apparatus constructed in accordance with the teachings of the invention. The apparatus includes a framework 11 supported by a plurality of legs 12 and within which is mounted a portion of the pull fitting apparatus 13 constructed in accordance with the invention. The apparatus 13 includes a generally rectangular mounting plate 14. The apparatus 13 is supported by the rods 15 and 16 within the opening in the framework 11. An additional structure (not shown) comprises a means for holding and moving a contact receiving member such as a printed circuit board substrate or an insulator body into which contacts are to be mounted in two directions, orthogonal to the axes of the mounting plate 14 such that the contact receiving member may be positioned at any selected location with respect to the pull fitting apparatus 13. Thus, a full printed circuit backpanel loaded with contacts may be progressively stepped along in a cyclic, orthogonal pattern to sequentially pullfit all the adjacent rows of contact.

The mounting plate 14 has slideably mounted thereon a pair of gripping jaws 18 and 19. The jaws 18 and 19 include plate portions 22 and 23 having opposed edges which are generally perpendicular to the plate portions and to the underlying mounting plate 14. The plate portions 22 and 23 are mounted for sliding movement across the upper surface of the mounting plate 14. The facing edges of the plates 22 and 23 are terminated in a pair of upstanding jaw members 24 and 25 integrally formed with the plates 22 and 23, respectively, and extending perpendicular thereto. The inner faces 26 and 27 of the jaw members 24 and 25 are also generally flat and perpendicular to the upper surface of the lower mounting plate 14, and horizontally serrated for gripping. A central vertically extending support bar 28 extends upwardly from the lower mounting plate 14 between the inner faces 26 and 27 of the two jaw members 24 and 25 and includes walls 30 and 31 which are parallel to the inner jaw faces 26 and 27 and perpendicular to the sliding plates 22 and 23, respectively. The upstanding support bar 28 also includes a plurality of vertically extending apertures 32, the function of which will be more fully described below.

Figure 2:
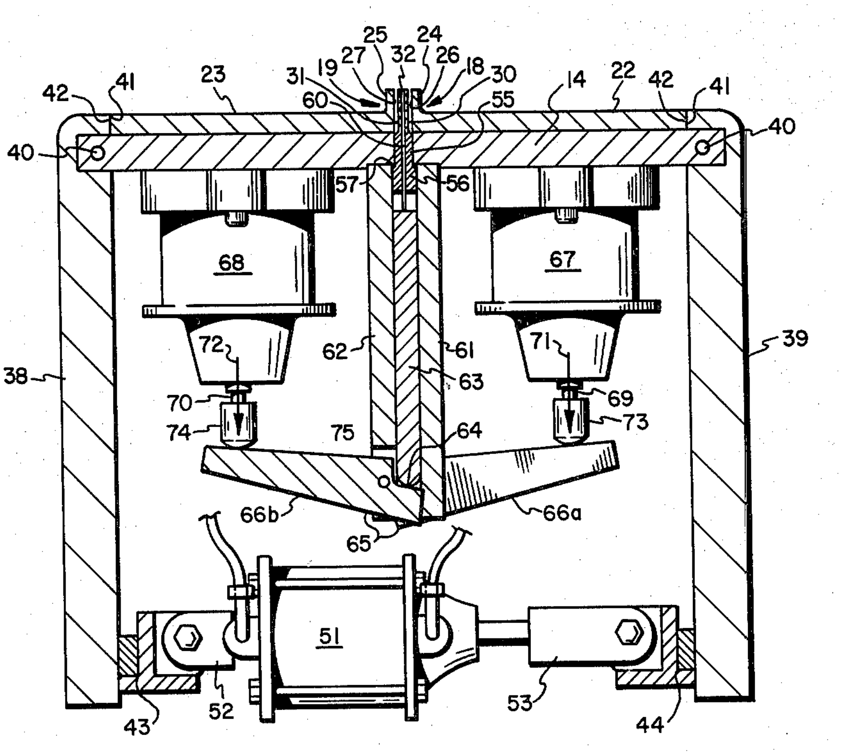
FIG. 2 is a side view of an apparatus constructed in accordance with the teachings of the invention.

The plates 22 and 23 are spring biased away from one another by means of pairs of loading springs 34 and 35 which are attached between the sliding plates 22 and 23, respectively, and the underlying support plate 14. The support plate 14 includes a plurality of slots 36 formed along opposed outer peripheral edges each of which slots receives the upper end of one of a plurality of actuational levers 38 and 39, respectively, on each side. Each of the actuation levers 38 and 39 are pivotally fixed to the underlying support plate 14 by means of pivot pins 40 (FIG. 2). The shorter portions of the actuation levers 38 and 39 includes flat surfaces 41 which are in abutting engagement with the rear peripheral edges 42 of the sliding plates 22 and 23.

Referring now to FIG. 2, there is shown the horizontal mounting plate 14 upon which rest the slideable gripping plates 22 and 23. As can be seen, the actuation bars 38 and 39 are pivotably affixed to the base plate 14 by pivot pins 40. The opposite ends of the pivot bars 38 are all mounted together by transverse bar 43 while the ends of bars 39 are connected together by transverse bar 44. The two transverse bars 43 and 44 are connected respectively to opposite ends of a pair of double acting horizontal air cylinders 50 (not shown) and 51. Cylinder 51 is connected through pivotal attachments 52 and 53. Two pneumatic cylinders are used so that there is pressure at each end of the transverse bars 43 and 44.

The upstanding substrate support bar 28 extends from below up through the support plate 14 via a neck portion 55 which is connected to an enlarged neck section 56 which is in turn locked in position beneath the mounting plate 14 by means of a radially extending shoulder 57. Each of the apertures 32 extend through the support bar 28 and each slideably mounts a cylindrical pin member 60. Mounted beneath the support plate 14 in a parallel vertically extending relationship are a pair of guide plates 61 and 62 between which is slideably mounted a pin actuation plate 63. The lower edge 64 of the pin actuation plate 63 is rounded and positioned in engagement with the shorter ends 65 of a pair of actuation levers 66*a* and 66*b* at opposite ends of the plate. The bases of a pair of vertical air cylinders 67 and 68 are mounted to the underside of the support plate 14. Piston rods 69 and 70 of the air cylinders 67 and 68, respectively, are positioned in engagement with the longer ends of the actuating levers 66*a* and 66*b*. Piston rods 69 and 70 have attached to the ends thereof screw on caps 73 and 74. Rotating the caps 73 and 74 effectively lengthens or shortens the rods 69 and 70 to change the length of movement of the pins 60. The actuation levers 66*a* and 66*b* are connected, respectively, to the guide plates 61 and 62 by means of pivot pins 75.

In operation, when the air cylinders 50 and 51 are actuated to extend their pistons outwardly, they move the lower ends of actuation levers 38 and 39 outwardly which, through substantial lever action, move the flat surfaces 41 on the shorter ends of the levers inwardly. Inward movement of two surfaces 41 of the levers 38 and 39 causes inward movement of the outer edges 42 of the sliding plates 22 and 23. Inward movement of the plates 22 and 23 causes the inner surfaces 26 and 27 of the two jaw members 24 and 25 to move toward gripping engagement with the upwardly extending walls 30 and 31 of the support bar 28 and grip therebetween anything which is positioned in the open spaces between the two pairs of jaws.

Actuation of the air cylinders 67 and 68, extends the pistons 69 and 70 in the direction of arrows 71 and 72. Two pistons, one at each end of the plate 63, are used to prevent the plate from twisting. Downward movement of the pistons 69 and 70 also moves the longer ends of the actuation levers 66*a* and 66*b* downwardly and the shorter ends thereof 65 upwardly. Upward movement of shorter ends 65 of the actuation levers 66*a* and 66*b* causes the ends 65 to bear upwardly on the lower rounded edge 64 of the pin actuation plate 63 with substantial leverage. Upward movement of the pin actuation plate 63 moves the entire row of actuation pins 60-60 upwardly within their apertures 32-32 to raise upwardly any body which might be positioned above the open apertures 32-32 of the upstanding support bar 28.

Figure 3:
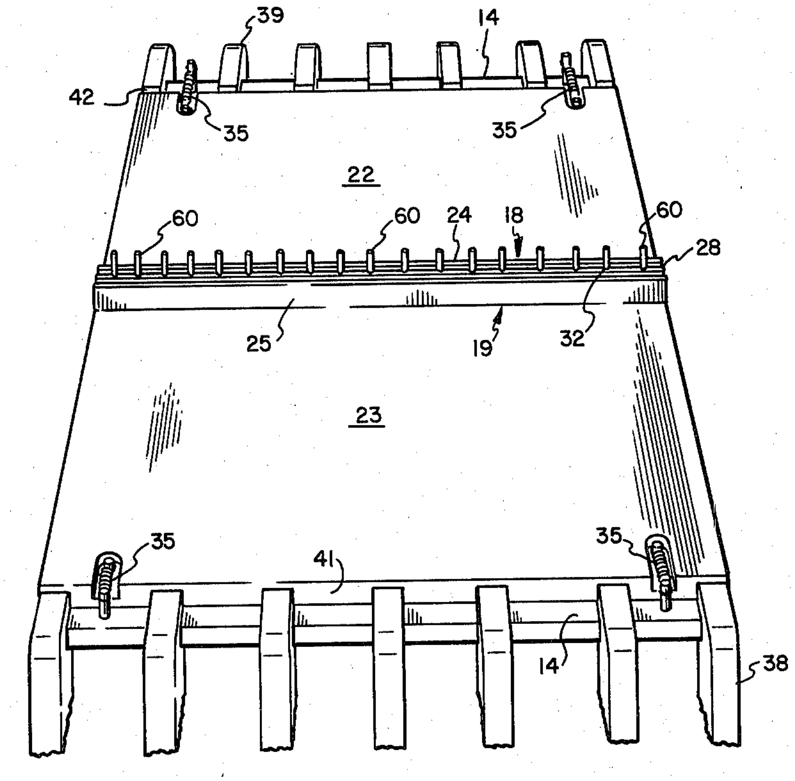
FIG. 3 is a top perspective view of the apparatus of FIG. 1 with the seating pins thereof extended.

Referring briefly to FIG. 3, there is shown therein a perspective view of the upper portion of the apparatus of the invention shown in FIG. 2. As shown in FIG. 3, the vertical air cylinders 67 and 68 have been actuated to raise the pin actuation plate 63 and thereby move the row of actuation pins 60-60 upwardly within the apertures 32-32 of the support bar 28. It can be seen that any structure positioned on top of the support bar 28 will be moved upwardly by the upward movement of the actuation pins 60.

Figure 4A:
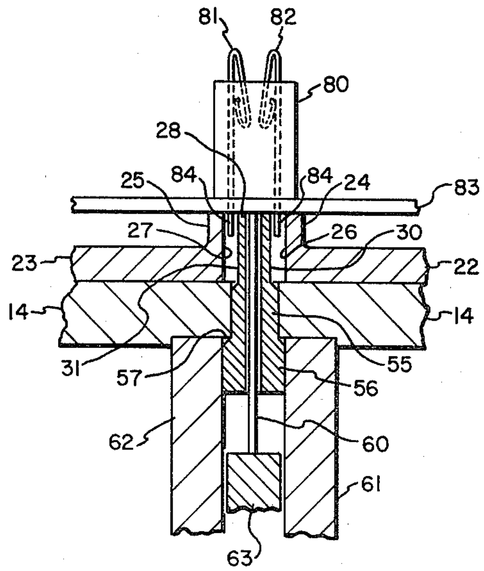
FIG. 4*a* is a schematic side view of the apparatus of the invention with the gripping jaws open and the seating pins retracted.

In reviewing the sequence of operation and referring next to FIG. 4A, there is shown a partial vertical cross section through the apparatus having a connector structure positioned thereon for pull fit mounting upon a substrate. The specific electrical structure positioned on the apparatus is that of an insulative housing 80 having a plurality of rows of contacts 81 and 82 (the rows extend into the plane of the drawing) positioned therein for mounting within the housing and upon a printed circuit board substrate 83. A connector assembly of this type is shown in U.S. Pat. No. 4,184,735 assigned to the assignee of the present invention. The tail portions 84 of the contacts protrude from the bottom of the insulative housing 80 and extend down through aligned apertures in the substrate 83. The insulative housing 80 and the printed circuit board substrate 83 are all positioned above the apertures 32 in the vertically extending support bar 28. The substrate and overlying connector are initially placed upon the support bar 28 while the vertical air cylinders 67 and 68 (FIG. 2) are unoperated and, therefore, the actuation plate 63 and the actuation pins 60 are in a retracted position.

During positioning of the insulative housing 80 and the printed circuit board substrate 83 the horizontal air cylinders 50 and 51 (FIG. 2) is unactuated so that the two pairs of jaw faces 26-30 and 27-31 are open. The housing 80 is positioned directly above the support bar 28 with the contact tail portions 84 protruding through the apertures in the printed circuit board substrate 83. One row of contact tail portions 84 is positioned between the open jaw faces 26-30 while the adjacent, parallel row of contact tail portion 84 is positioned between the open jaw faces 27-31.

Figure 4B:
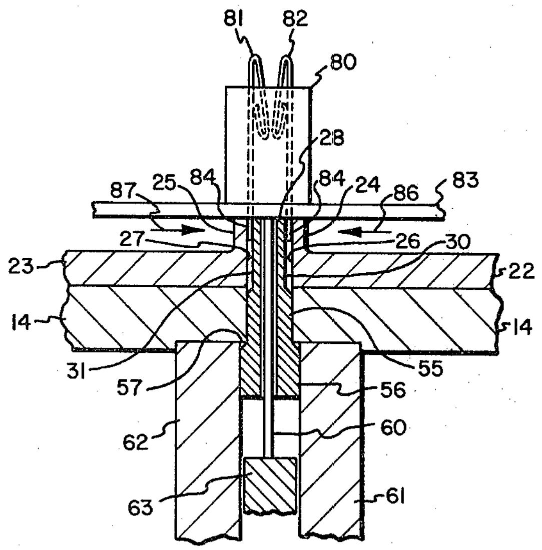
FIG. 4*b* is a side schematic view of the apparatus of the invention with the gripping jaws closed and the seating pins retracted.

Referring next to FIG. 4B, once the housing 80 and substrate 83 are positioned above the support bar 28 with the two rows of contact tails 84 between the two pairs of open jaw faces, the horizontal air cylinders 50 and 51 (FIG. 2) are actuated to move the two jaw faces 26 and 27 in the direction of arrows 86 and 87 and firmly clamp one row of contact tails 84 between one pair of jaw faces 26-30 and clamp the other row of contact tails 84 between the other pair of jaw faces 27-31.

Figure 4C:
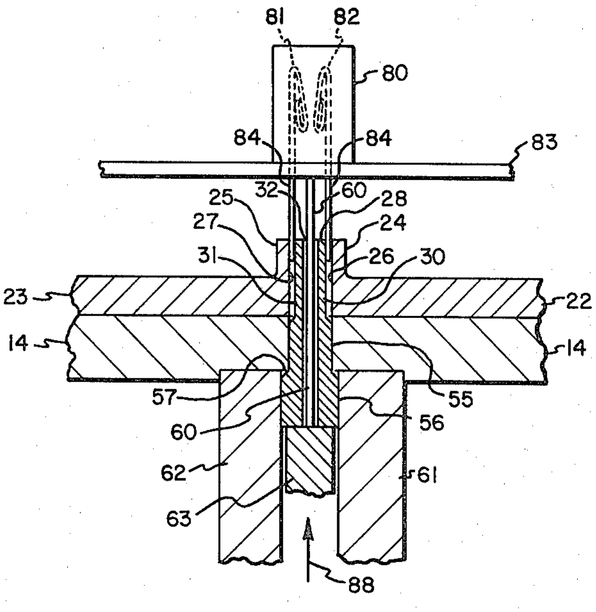
FIG. 4*c* is a side schematic view of the apparatus of the invention with the gripping jaws closed and the seating pins extended.
Figure 3:
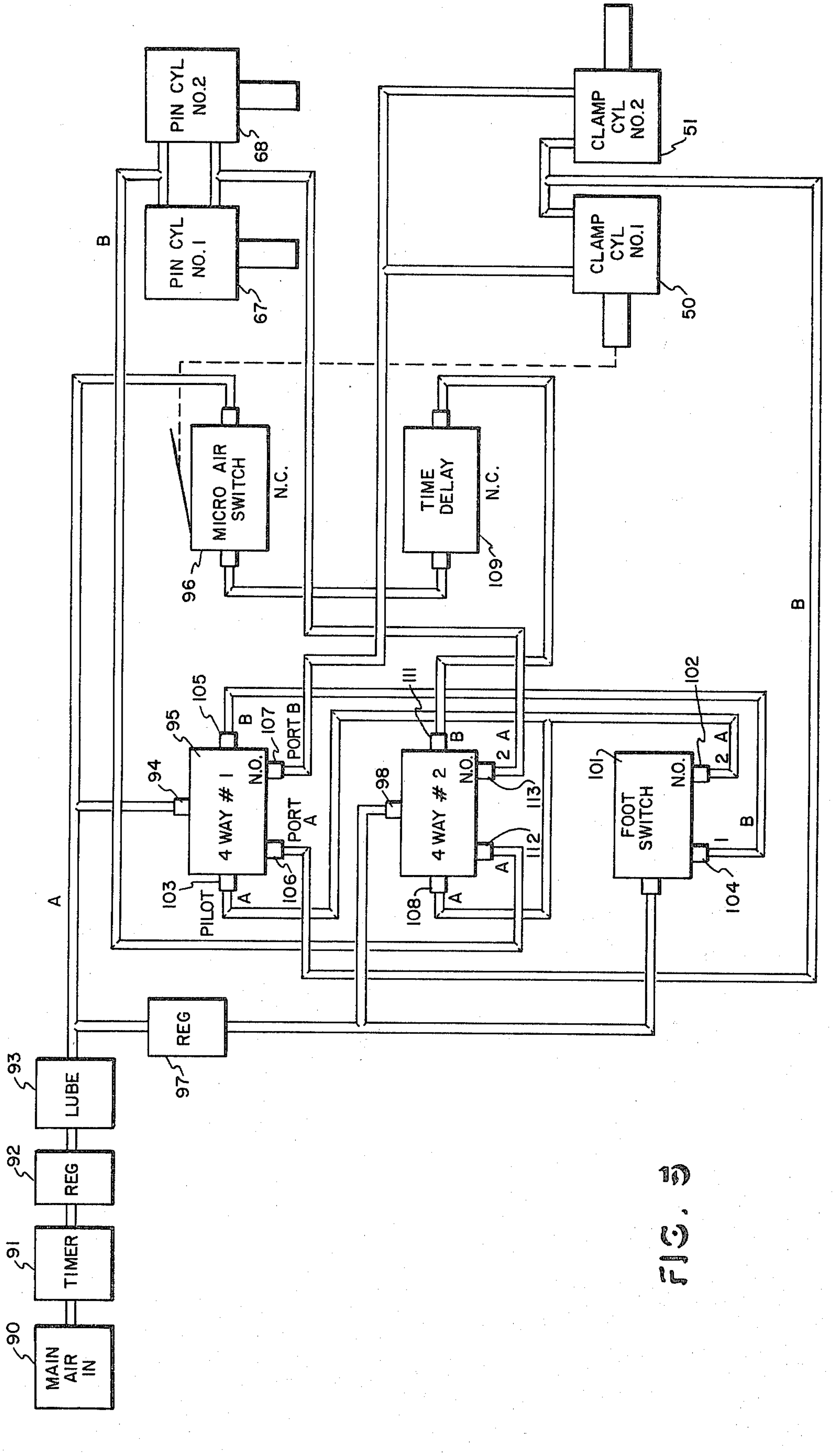

Referring to FIG. 4C, when the contact tails 84 are firmly gripped by the two pairs of jaw members 26-30 and 27-31, the two vertical air cylinders 67 and 68 (FIG. 2) are actuated to move the actuation plate 63 upwardly in the direction of arrow 88, as shown in FIG. 4C. Upward movement of the plate 63 causes the actuation pins 60 to move upwardly within each of vertically extending mounting apertures 32 formed within the support bar 28. The upward movement of the pins 60 raises the printed circuit board substrate 83 and the insulative housing 80 positioned thereon while the contact tails 84 are held stationary by the two pairs of clamped jaw faces 26-30 and 27-31. Thus, the contact rows 81 and 82 are press fitted, or interferingly fitted, down into both the body of the insulative housing 80 and the apertures formed within the printed circuit board substrate 83 to rigidly mount the contacts therein.

Following press fitting of the contacts, both the pair of horizontal air cylinders 50 and 51 and the pair of vertical air cylinders 67 and 68 are de-actuated to release the grip of the pair of four faces 26-30 and 27-31 and to return the actuation pins 60 to their original position within the apertures 32 in the support bar 28. The apparatus is then ready to receive another pair of rows of contacts to be pull fitted into mounting members.

Thus, it can be seen how the apparatus of the present invention may be programmed for horizontal and vertical movement and for intermittent actuation of the respective air cylinders therein such that individual rows of contacts may be pulled home sequentially. Moreover, it can also be seen how with additional control of x and y movements of a vertically spaced substrate within which contacts are to be installed, can be coordinated so that each successive row is in turn pull fitted into place.

Having described the invention in connection with specific embodiments thereof, it is to be understood that further modifications may now suggest themselves to those skilled in the art and is intended to cover certain modifications as follows within the scope of the appended claims.

Referring now to FIG. 5, there is shown a pneumatic schematic diagram of the various cylinders, valves and switches used to operate the system of the invention. A main air input supply 90 is connected through a filter 91, a regulator 92 and a lubricator 93. The regulator 92 is set at about the minimum value the supply line might drop to so that the system will always see a constant pressure. The supply pressure is connected directly to the supply input port 94 of a first four way valve 95, and to the input of a micro air switch 96. The supply input is connected through a second regulator 97 to the supply input port 98 of a second four way valve 99 and to the input of a foot switch 101. The unactuated output 102 of the switch 101 is connected back to the A pilot input 103 of the valve 95. The actuated output 104 of the switch 101 is connected to the B pilot input 105 of the valve 95. The A port 106 of the valve 95 is connected to supply air pressure to extend the pair of clamp cylinders 50 and 51. The B port 107 of the valve 95 is connected to withdraw the pair of clamp cylinders 50 and 51.

The unactuated output 102 of the footswitch 101 is also connected to the A pilot input 18 of the valve 99. The output of the micro air switch 96 is connected through a time delay module 109 to the B pilot 111 of the switch 99. The A port 112 of the valve 99 is connected to extend the pair of pin cylinders 67 and 69 while the B port 113 is connected to withdraw the pistons of the pair of pin cylinders 67 and 68.

In operation, with the foot switch unactuated pressure is supplied from the B port 107 of valve 95 to hold both clamp cylinders 50 and 51 open. Similarly, with foot switch 101 unactuated, pressure from the B port 113 of valve 99 holds pin cylinders 67 and 68 unactuated. Depression of foot switch 101 causes pressure at port 104 which is coupled to the B pilot 105 of valve 95 and applies pressure out the A port 106 to operated the clamp cylinders 50 and 51. Full operating movement of clamp cylinders 50 and 51 operates the micro air switch 96 as shown by the dotted line 150, which, through the time delay 109 applies pressure to the B pilot 111 of valve 99. The time dealy is about ½ second; just long enough to permit the clamp cylinders 50 and 51 to seat thoroughly. Pressure from the A port 112 operates the pin cylinders 67 and 68 to pull fit the contacts. Release of the foot switch 101 causes all the valves and cylinders to return quickly to an unoperated condition due to the aforementioned back pressure.

It is thus believed that the operation and construction of the present invention will be apparent from the foregoing description. While the method and apparatus shown and described has been characterized as being preferred it will be obvious that various changes and modifications may be made therein without departing from the spirit and scope of the invention as defined in the following claims.

What is claimed is:

1. A method of mounting contacts having tails protruding in two spaced parallel rows from the bottom of a mounting member by applying a longitudinal force to said contacts relative to said mounting member; said method comprising the steps of:

providing a support member for supporting the mounting member between the contact tails protruding therefrom, said support member including a plurality of apertures therethrough;

positioning said mounting member and contacts upon said support member;

clamping the contact tails to the support member;

providing means for moving the mounting member upwardly relative to the support member and contacts clamped thereto, which means includes mounting pins slidably positioned within said apertures and extendable through said support member; and moving the mounting member upwardly relative to the support member and contacts clamped thereto by extending said mounting pins through said support member and into engagement with said mounting member.

2. Improved apparatus for mounting contacts positioned within a mounting member of the type wherein contacts having tails protruding from the bottom of the mounting member in two spaced parallel rows are mounted within the mounting member by the application of a longitudinal force to the contacts, the improvement comprising:

an upstanding support member including a plurality of apertures formed therethrough for positioning beneath the mounting member in support thereof and between the contact tails protruding therefrom;

means for clamping the contact tails against the support member with the mounting member thereabove; and means for moving the mounting member upwardly relative to the support member and contacts clamped thereto, said mounting member movement means including mounting pins slidably positioned within said apertures and extendable through said support member for engaging and moving said mounting member upwardly for mounting the contacts within the mounting member.

3. The apparatus as set forth in claim 2 wherein said mounting member movement means further includes a pneumatic actuation cylinder and pivot linkage, said pivot linkage coupling said mounting pins to said actuation cylinder.

4. A system for mounting contacts having tails protruding in two spaced parallel rows from the bottom of a mounting member by applying a longitudinal force to said contact relative to said mounting member, said system comprising:

a rigid, upstanding, elongate support member including a flat top surface having a width about equal to the spacing between adjacent rows of contact tails, and opposed flat sides, said support member also including a plurality of spaced apertures extending through said support member parallel to said sides, each of said apertures having openings in the flat top surface;

a pair of generally flat clamp jaws, one jaw being normally spaced from one of said flat sides of the support member and one jaw being normally spaced from the other of said sides;

a mounting pin slidably positioned within each of the apertures extending through said support member;

means for moving said flat clamp jaws toward the opposed flat sides of the support member to rigidly clamp the tails of contacts positioned therebetween when the bottom of a mounting member is positioned upon the flat top surface of the support member; and means actuatable while said jaws clamp said contact tails to move the mounting pins upwardly through said support member and raise the mounting member to pull the contacts into position within said mounting member.

5. The apparatus as set forth in claim 14 wherein said flat clamp jaws each include horizontal serrations for facilitating the gripping of the tails of the contacts against said support member.

6. The apparatus as set forth in claim 4 wherein said flat camp jaws are spring biased away from one another and from said support member for receiving the tails of contacts therebetween when the bottom of a mounting member is positioned upon the flat top surface of the support member.

7. The apparatus as set forth in claim 4 wherein said system further comprises a generally flat mounting plate having a central elongate aperture for receiving said elongate support member therethrough and said clamp jaws thereupon in slidable engagement with said mounting plate.

8. The apparatus as set forth in claim 7 wherein said flat clamp jaws each include plate portions extending outwardly therefrom and lying upon said mounting plate in slidable engagement therewith, said plate portions including opposed outer edges, each formed generally perpendicular to said plate portions and said underlying mounting plate.

9. The apparatus as set forth in claim 8 wherein said means for moving said flat clamp jaws toward the opposed flat sides of the support member includes at least one actuation lever pivotally affixed to said mounting plate having a flat surface in abutting engagement with said opposed, outer edges of said plate portions, and means for causing said actuation lever to pivot about said mounting plate and against said plate portions for moving said plate portions and jaws inwardly.

10. The apparatus as set forth in claim 9 wherein a plurality of actuation levers are pivotally affixed to said mounting plate, and said means for causing said actuation lever to pivot comprises at least one pneumatic cylinder coupled to said actuation levers.

11. The apparatus as set forth in claim 10 wherein a pair of pneumatic cylinders are provided and connected one with the other through a pair of transverse bars, each cylinder being of a double acting variety coupled one with the other on opposite ends of said transverse bars and with said actuation levers coupled to said transvers bar between said cylinders.

12. The apparatus as set forth in claim 4 wherein said means for moving said mounting pins includes a pin actuation element beneath said mounting pins and actuation linkage for moving said actuation element and said pins upwardly.

13. The apparatus as set forth in claim 9 wherein said actuation element includes a pair of guide plates with an actuation plate positioned for slidable movement therebetween.

14. The apparatus as set forth in claim 13 wherein said actuation linkage includes at least one pneumatic cylinder coupled to said actuation plate for moving said plate upwardly relative to and between said guide plates.

15. The apparatus as set forth in claim 14 wherein said actuation linkage further includes an actuation lever pivotally mounted relative to said guide plates and having first and second end portions, said first end portion of said actuation lever being coupled to said pneumatic cylinder and said second end being coupled to said actuation plate for the movement thereof in response to actuation of said pneumatic cylinder.

16. The apparatus as set forth in claim 4 wherein said system further includes control means for automatically actuating said mounting pin movement means after a preselected time delay following actuation of said clamp jaw movement means, wherein said contacts are clamped within said clamp jaws while said mounting pins are moved upwardly for pulling said contacts into position within said mounting member.

17. The apparatus as set forth in claim 13 wherein said clamp jaw movement means and said mounting pin movement means include pneumatic cylinders actuatable within a pneumatic network.

* * * * *